(12) United States Patent
Amaya Beltrán et al.

(10) Patent No.: US 10,833,689 B2
(45) Date of Patent: Nov. 10, 2020

(54) METHOD AND CIRCUIT FOR COMPENSATING FOR THE OFFSET VOLTAGE OF ELECTRONIC CIRCUITS

(71) Applicant: Universidad Industrial de Santander, Bucaramanga (CO)

(72) Inventors: Andrés Felipe Amaya Beltrán, Bucaramanga (CO); Rodolfo Villamizar Mejía, Bucaramanga (CO); Élkim Felipe Roa Fuentes, Bucaramanga (CO)

(73) Assignee: UNIVERSIDAD INDUSTRIAL DE SANTANDER, Bucaramanga (CO)

( * ) Notice: Subject to any disclaimer, the term of this patent is extended or adjusted under 35 U.S.C. 154(b) by 0 days.

(21) Appl. No.: 16/306,135

(22) PCT Filed: Jun. 28, 2017

(86) PCT No.: PCT/IB2017/053873
§ 371 (c)(1),
(2) Date: Jan. 20, 2020

(87) PCT Pub. No.: WO2018/002843
PCT Pub. Date: Jan. 4, 2018

(65) Prior Publication Data
US 2020/0186158 A1    Jun. 11, 2020

(30) Foreign Application Priority Data
Jun. 28, 2016    (CO) .................................. 16-171357

(51) Int. Cl.
*H03M 1/06*        (2006.01)
*H03K 3/356*       (2006.01)
(Continued)

(52) U.S. Cl.
CPC .......... *H03M 1/0607* (2013.01); *H03F 1/303* (2013.01); *H03K 3/356139* (2013.01); *H03M 1/66* (2013.01)

(58) Field of Classification Search
CPC ............................ H03M 1/0607; H03M 1/66; H03K 3/356139; H03F 1/303
(Continued)

(56) References Cited

U.S. PATENT DOCUMENTS 6,320,426 B1    11/2001    Shih
7,352,307 B2 *   4/2008    Iorgulescu .......... H03M 1/1019
                                                    341/118
(Continued)

FOREIGN PATENT DOCUMENTS

CN    104283558 A    1/2015
ES    2373282 A1    2/2012

OTHER PUBLICATIONS

Kunzhi Yu et al. "A 6.4 Gb/s source synchronous receiver core with cariable offset equializer in 65nm CMOS" VLSI Design, Automation, and Test (VLSI-DAT), 2013 International Symposium on, Apr. 22, 2013 IEEE. Apr. 22, 2013 pp. 1-4.
(Continued)

*Primary Examiner* — Khai M Nguyen
(74) *Attorney, Agent, or Firm* — The Morales Law Firm; Joseph L. Morales

(57) ABSTRACT

The present invention corresponds to a method and a circuit for compensating the offset voltage of electronic circuits, where the circuit implementing the method comprises: a dynamic comparator (1); a phase detector (6) connected to the dynamic comparator (1), the phase detector (6); a finite-state machine (9) connected to the phase detector (4), a first digital-analog converter (12) connected to an output of the finite-state machine (9); a second digital-analog converter (13) connected to another output (11) of the finite-
(Continued)

state machine (9); a polarization block (14) with a first input (15) connected to the output of the first digital-analog converter (12) and a second input (16) connected to the output of the second digital-analog converter (13); where the polarization block (14) polarizes an electronic circuit (17) and the dynamic comparator (1), the phase detector (6), and the finite-state machine (9) are connected to a clock signal (3). The method is characterized by the following steps: a) connecting a dynamic comparator to the output of the electronic circuit; b) measuring the phase change of the dynamic comparator outputs of step a by means of a phase detector; c) controlling the output signals of a finite-state machine according to the phase detector output of step b, which can be coded "forward", "backward" or "in phase"; c) converting the output of the finite-state machine of step c to an analog signal using two digital-analog converters; d) connecting the output of the two digital-analog converters of step d to the control terminal of the electronic circuit polarization block; and, e) modifying the polarization current of the electronic circuit polarization block by means of the output signals of the two digital-analog converters connected in step e.

6 Claims, 7 Drawing Sheets

(51) Int. Cl.
*H03M 1/66* (2006.01)
*H03F 1/30* (2006.01)

(58) Field of Classification Search
USPC .......................... 341/118, 120, 155; 327/307
See application file for complete search history.

(56) References Cited

U.S. PATENT DOCUMENTS

| | | |
|---|---|---|
| 7,541,857 B1 | 6/2009 | Wong et al. |
| 7,944,248 B2 | 5/2011 | Nguyen et al. |
| 2008/0150772 A1 | 6/2008 | Cao et al. |
| 2012/0206281 A1 | 8/2012 | Bashirullah et al. |

OTHER PUBLICATIONS

Perrot, "High Speed Communication Circuits and Systems". MIT Opencourseware, Dec. 21, 2003, pp. 21, 36-47.

* cited by examiner

METHOD AND CIRCUIT FOR COMPENSATING FOR THE OFFSET VOLTAGE OF ELECTRONIC CIRCUITS

FIELD OF INVENTION

The present invention relates to electronic methods and devices for offset voltage compensation in electronic circuits.

DESCRIPTION OF PRIOR ART

Offset voltage is one of the main limitations in electronic circuits, such as data converters and data interfaces especially in high-speed devices. Offset voltage sets the minimum signal voltage that an electronic circuit can sense. In the case of converter circuits, the offset voltage imposes the maximum resolution the converter circuit can develop; for example, in serial interfaces, the offset voltage limits the maximum transfer rate. Therefore, it is important that an alternative be included to help compensate the offset voltage, for the proper operation of electronic circuits.

Traditional methods and circuits for offset compensation need to interrupt the path of the signal being processed. In prior art, both U.S. Pat. No. 7,541,857B1 and U.S. Pat. No. 6,320,426B1 correspond to patent documents. These disclosures refer to methods and circuits where the input voltage needs to be adjusted to a common mode level to start calibration routines, afterwards.

U.S. Pat. No. 7,541,857B1 discloses an offset voltage compensation circuit by impedances and includes programmable impedance circuits at the input of a programmable device. Programmable impedance circuits can be configured to apply a compensation voltage to the input nodes to reduce or eliminate offset voltage. The impedance compensation circuit may include resistors in series or current sources in parallel. A set of bypass switches selectively applies resistors or current sources to an input node of the electronic circuit, thereby compensating the offset voltage and impedance imbalances.

This behavior adds extra load to the circuit input, so the maximum operating speed of the electronic circuit is affected.

In the prior art, the use of an additional trajectory that serves as support for offset voltage compensation is frequent, while the electronic circuit is being calibrated. This involves an increase in power consumption and implementation cost, since the additional trajectories must continually be calibrated.

Prior art also reports methods to compensate for offset voltage without the need to interrupt the signal path, with the disadvantage that its use is limited to data converter circuits and discrete circuits, or applications where large digital processing capacity is available.

U.S. Pat. No. 6,320,426B1 discloses a method based on a digital integrator and digital-analog converter to find a voltage that added to the input signal, compensates the offset voltage. This limits the maximum speed that can be developed in the electronic circuit, due to the use of circuits of switched capacitors and discrete integrators. Therefore, its application in high-speed interfaces is affected. Furthermore, power consumption and implementation costs rise.

From the study of prior art, it is established that methods and circuits are required to limit the offset voltage in electronic circuits, which act continuously throughout the operation of the electronic circuit, without interrupting the signal path.

BRIEF DESCRIPTION OF THE INVENTION

The present invention corresponds to a method and a circuit that implements the method of the invention to compensate the offset voltage of electronic circuits.

The circuit to compensate the offset voltage of electronic circuits comprises:
- a dynamic comparator with an input connected to a clock signal;
- a phase detector connected to the dynamic comparator;
- a finite-state machine with two outputs, connected to the phase detector;
- a first digital-analog converter connected to an output of the finite-state machine;
- a second digital-analog converter connected to the other output of the finite-state machine; and,
- a polarization block with a first input connected to the output of the first digital-analog converter and a second input connected to the output of the second digital-analog converter The polarization block polarizes an electronic circuit, while the dynamic comparator, the phase detector, and the finite-state machine are connected to a clock signal.

For the understanding of the present invention, a polarization block will be understood as a circuit that provides current and/or voltage, which is necessary to establish an operating point in an electronic circuit.

The method to compensate the offset voltage of electronic circuits is characterized by the following steps:
a) connecting a dynamic comparator to the output of the electronic circuit;
b) measuring the change in the output phase of the dynamic comparator of step a by means of a phase detector;
c) controlling the output signals of a finite-state machine according to the phase detector output of step b, which may be coded "forward", "backward" or "in phase";
d) converting the output of the finite-state machine of step c to an analog signal, using two digital-analog converters;
e) connecting the output of the two digital-analog converters of step d to the control terminal of the polarization block in the electronic circuit; and,
f) modifying the polarization current of the polarization block in the electronic circuit by means of the output signals of the two digital-analog converters connected in step e.

In step f) an additional voltage is generated with opposite polarity to the offset voltage of the electronic circuit and the dynamic comparator, which is a product of the polarization current change in the electronic circuit polarization block.

DETAILED DESCRIPTION OF THE INVENTION

The present invention corresponds to a method and a circuit that implements the method to compensate the offset voltage of electronic circuits.

Figure 1:
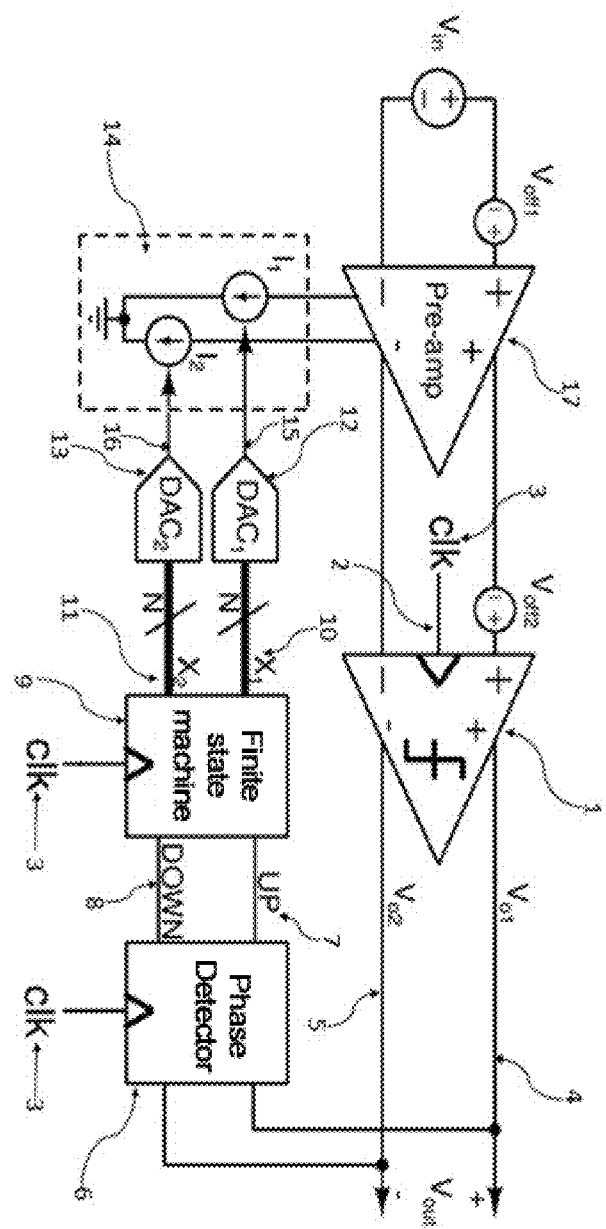
FIG. 1 Illustrates an offset voltage compensation circuit of the invention.

Referring to FIG. 1, the circuit to compensate the offset voltage of electronic circuits comprises:
- a dynamic comparator (1) having a first output (4) and a second output (5);
- a phase detector (6) connected to a first output (4) and a second output (5) of the dynamic comparator (1), and the phase detector (6) has a first output (7) and a second output (8);
- a finite-state machine (9) connected to the first output (7) and the second output (8) of the phase detector (4), the finite-state machine (5) has a first output X1 (10) and a second output X2 (11);
- a first digital-analog converter (12) connected to the first output (10) of the finite-state machine (9);
- a second digital-analog converter (13) connected to the second output (11) of the finite-state machine (9); and,
- a polarization block (14) with a first input (15) connected to the output of the first digital-analog converter (12) and a second input (16) connected to the output of the second digital-analog converter (13);

The polarization block (14) polarizes an electronic circuit (17) and the dynamic comparator (1), the phase detector (6), and the finite-state machine (9) are connected to a clock signal (3).

In one embodiment of the invention, the electronic circuit (17) can be made up of different electronic circuits, e.g. amplifiers, cascaded, in series, in parallel and combinations of the above configurations and the invention compensates the circuit offset voltage composed in the aforesaid manner and also compensates the offset voltage provided by the dynamic comparator (1).

In the invention, the first output X1 (6) and the second output X2 (7) of the finite-state machine (5) correspond to digital outputs of N bits in length with N belonging to the natural numbers. In one embodiment of the invention, the first output X1 (6) and the second output X2 (7) of the finite-state machine (5) correspond to digital outputs of 8 bits in length.

The phase detector encodes the "forward", "backward" or "in phase" states of the first output input signal (4) and the second output (5) of the dynamic comparator (1) and digitally encodes the same.

Figure 2:
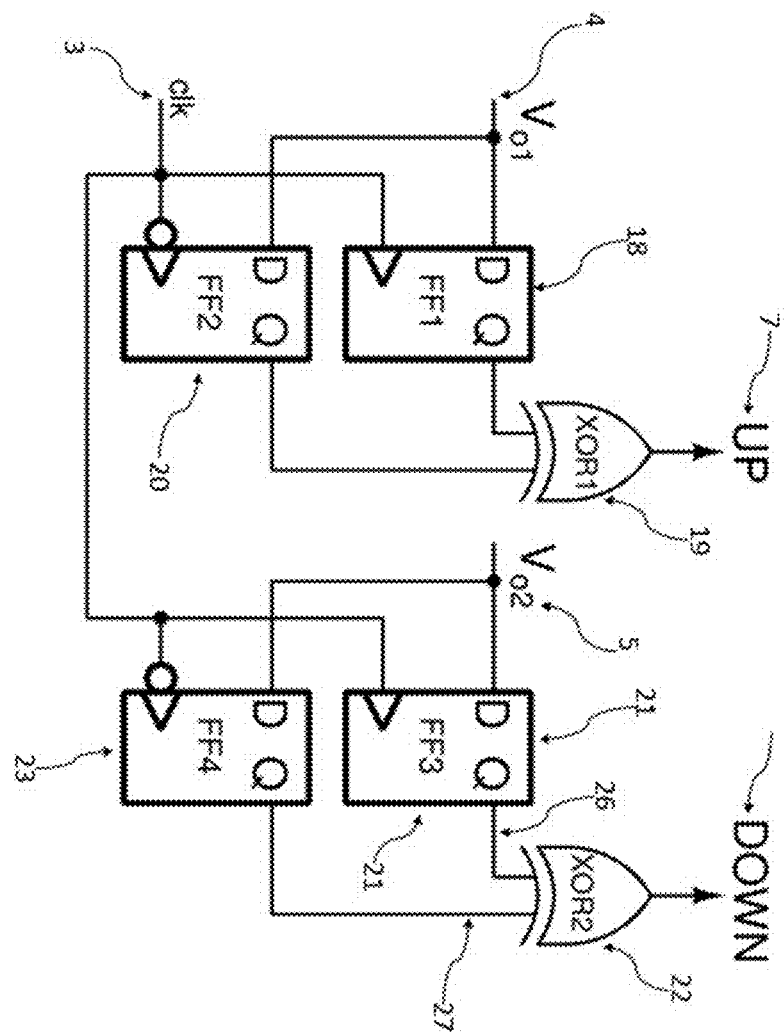
FIG. 2 Illustrates a phase detector circuit of one invention embodiment.

In an invention embodiment and referring to FIG. 2, the phase detector (6) comprises:
- a first D-type Flip-Flop (18) activated by rising edge, where its input D is connected to the first output (4) of the dynamic comparator (1) and its clock signal input is connected to the clock signal (3);
- a second D-type Flip-Flop (20) activated by falling edge, where its input D is connected to the first output (4) of the dynamic comparator (1); its clock signal input is connected to the clock signal (3);
- a third D-type Flip-Flop (21) activated by rising edge, where its input D is connected to the second output (5) of the dynamic comparator (1); and its clock signal input is connected to the clock signal (3);
- a fourth D-type Flip-Flop (23) activated by falling edge, where its input D is connected to the second output (5) of the dynamic comparator (1); and its clock signal input is connected to the clock signal (3);
- a first XOR gate (19) of two inputs, the first input (24) of the first XOR gate (19) is connected to the Q output of the first D-type Flip-Flop (18), the second input (25) of the first XOR gate (19) is connected to output Q of the second D-type Flip-Flop (20) and the output of the first XOR gate (19) delivers a UP signal (7);
- a second XOR gate (22) of two inputs, the first input (26) of the second gate XOR (22) is connected to the output Q of the third D-type Flip-Flop (21), the second input (27) of the second XOR gate (22) is connected to output Q of the fourth D-type Flip-Flop (23); and the output of the second XOR gate (22) delivers a DOWN signal (8).

In one invention embodiment the phase detector encodes the "forward", "backward" or "in phase" states of the input signal (first output (4) and the second output (5) of the dynamic comparator (1)) and digitally encodes them by making the DOWN signals (8) delivered by the second XOR gate (22) and the UP signal (7) delivered by the first XOR gate (19) have the following encoding: "go ahead" then UP (7) set high, "back" then DOWN (8) set high or "phase" then UP (7) set high and DOWN (8) set high.

The invention of the circuit and the modalities described above, implements a method to compensate the offset voltage of electronic circuits.

The method is characterized by the steps:
a) connecting a dynamic comparator to the output of the electronic circuit;
b) measuring the change in the phase of the dynamic comparator outputs in step a by means of a phase detector;
c) controlling the output signals of a finite-state machine according to the output of a step b phase detector, which can be coded "forward", "backward" or "in phase";
d) converting the output of the finite-state machine of step c to an analog signal using two digital-analog converters;
e) connecting the output of the two digital-analog converters of step d to the control terminal of the electronic circuit polarization block; and,
f) modifying the polarization current of the electronic circuit polarization block by means of the output signals of the two digital-analog converters connected in step e.

Figure 3:
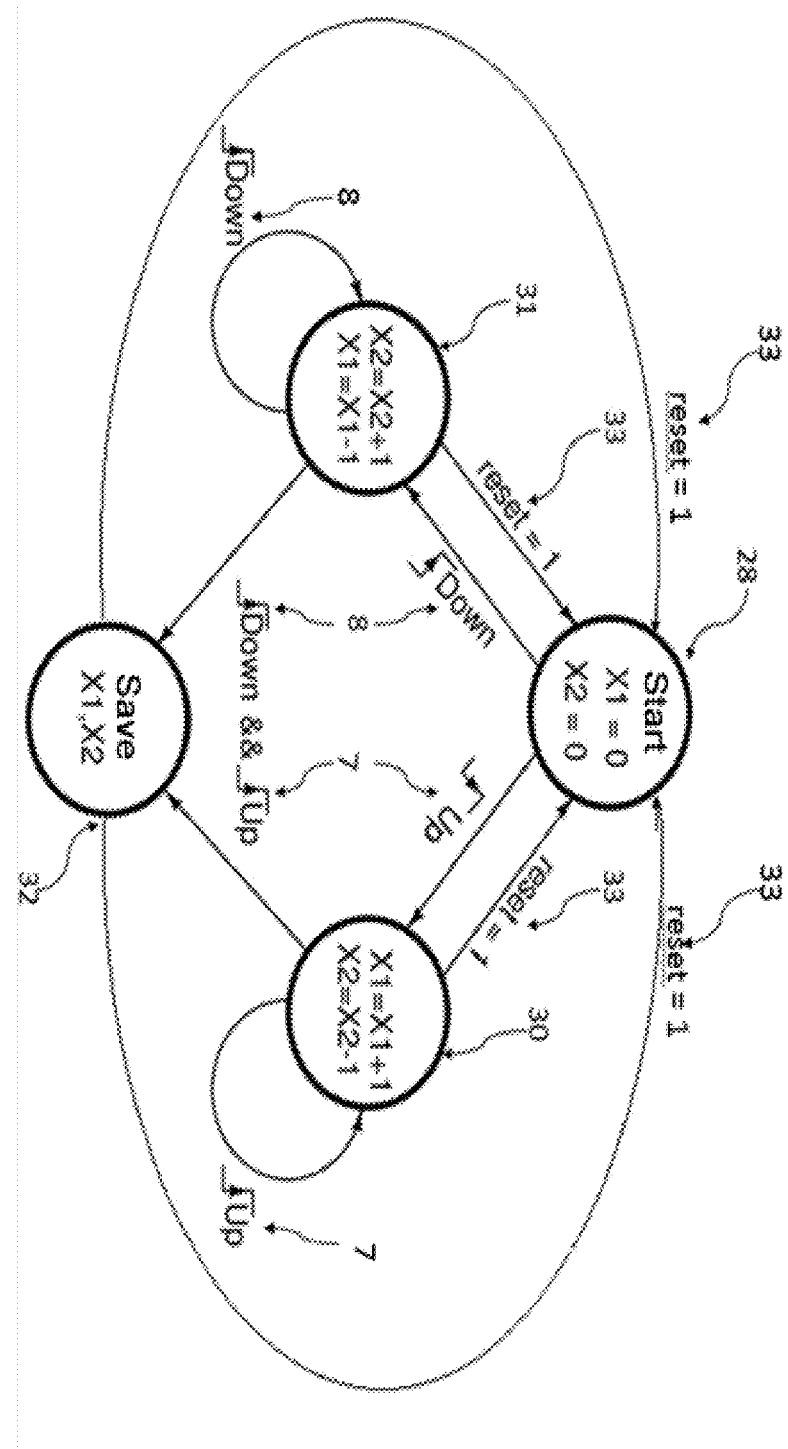
FIG. 3 Illustrates a status diagram of the finite-state machine of the invention.

Referring to FIG. 3 the finite-state machine, in one invention embodiment, may consist of four possible states: "Start" (28), "Increase Pol" (30), "Decrease Pol" (31), and "Save" (32) which for the present invention means end of state, each of these possible states are encoded in standard binary code such as 00, 01, 10 and 11 respectively. In addition, the finite-state machine has two outputs of eight bits each, coded in a standard manner, in one invention embodiment.

However, the finite-state machine of the invention is not limited to indicating the number of states and providing an encoding thereof, since it is an Ascending/Descending counter with enabling terminals.

Referring to FIG. 3, in one invention embodiment, step c fulfills the following state transition sequence:

Starting in the "Start" (28) state, if the UP input signal (7) changes from a low to high state, the machine changes to the "Increase Pol" state (30) where the output signal X2 decreases by one unit and the X1 signal increases by one unit;

Starting in the "Start" state, if the DOWN input signal (8) changes from a low to high state, the machine changes to the "Decrease Pol" state (31) where the output signal X2 increases by one unit and the signal X1 decreases by one unit;

Starting in the "Increase Pol" state (30), if the UP input signal (7) changes from a low to high state, the machine remains in the same state;

Starting in the "Decrease Pol" state (31), if the DOWN input signal (8) changes from a low to high state, the machine remains in the same state;

Starting in the "Increase Pol" state (30), if the UP input signal (7) changes from a low to high state and DOWN (8) changes from a low to high state, the machine goes to the "Save" state (32) where signals X1 (10) and X2 (11) are not altered;

Starting at the "Decrease Pol" state (31), if the DOWN input signal (8) changes from a low to high state and the UP input signal (7) changes from a low to high state, the machine goes to the state "Save" (32) where signals X1 (10) and X2 (11) are not altered and saved;

Starting in any of the four states, if the reset signal goes to a high state, the machine goes to the "Start" state (28).

In step c, the phase detector encodes the "forward", "backward" or "in phase" states of the first output (4) and second output (5) of the dynamic comparator (1) and encodes them digitally, e.g. forward then UP (7) is high, back then DOWN (8) is high and in phase, then UP is high and DOWN (8) is high, and the states of the finite-state machine take the decrease pol, increase pol and in phase takes the save state, respectively.

In the "forward" phase it puts UP (7) in a high state and goes to the "Increase Pol" (30) state, "back" puts DOWN (8) in a high state and the "Decrease Pol" (31) or "in phase" puts UP (7) in high state and DOWN (8) in high state, passing subsequently to the "Save" state (32).

The digital outputs of the finite-state machine are converted into analog signals, also called analogs, by using the first digital-analog converter (12) and a second digital-analog converter (13), with output signals which modify the current of electronic circuit polarization. The adjustment of these currents compensates the total offset voltage throughout the circuit.

The operation of the method and circuit of the invention can be explained as follows: Referring to FIG. 1, and assuming the total offset voltage saturates both the electronic circuit (17) and the dynamic comparator (1), the output $V_{O1}$ (4) of the dynamic comparator is equal to the supply voltage not shown in FIG. 1 and what we will call VDD and VSS.

The output $V_{O2}$ (5) continuously oscillates between VDD and VSS due to the transition between the comparison and restart step of the dynamic comparator (1). As a consequence, any signal at the input to the electronic circuit with an amplitude less than the offset voltage will not generate any change in the transitions of the output signals $V_{O1}$ (4) and $V_{O2}$ (5).

Next, the output signals of the dynamic comparator (1) are connected to the input signals of a phase detector (6), in order to measure the difference between its phases.

Under conditions described above, and in the invention embodiment where the phase detector (6) is composed of four Flip-Flops, and referring to FIG. 1 and FIG. 2, the DOWN output (8) of the phase detector (6) is at a low level because, for each cycle of the clock signal, the third Flip-Flop (21) and fourth Flip-Flop (23) output is the same. On the contrary, the UP output is at a high level since the inputs of the first Flip-Flop (18) and second Flip-Flops (20) change at each clock cycle. For this reason, the finite-state machine increases its output signal $X_1$, while $X_2$ decreases. In this way, the output signal of the first digital-analog converter DAC1 (12) is increased, while the output of the second digital-analog converter DAC2 (13) decreases, causing the polarization current $I_1$ to be greater than $I_2$. This change in the polarization currents introduced to the electronic circuit induces an additional voltage, with the particularity that this induced voltage has a polarity opposite to the initial offset voltage. The offset voltage compensation ends at the moment when the magnitude of this additional voltage induced by the output signal of the first digital-analog converter DAC1 (12) and the output signal of the second digital-analog converter DAC2 (13) is the same as the offset voltage, so the sum of both voltages is canceled.

One of the main advantages of the invention is the fact that it can be executed without the need to cancel the input voltage and interrupt the signal transmission. This means that, unlike many methods proposed in the prior art, the input signal does not need to be interrupted and adjusted to a common mode level before correcting the offset voltage. As a consequence, no additional capacitive, inductive and/or resistive load is introduced at the input of the system, so the operating speed of the entire circuit does not degrade. The fact of having to adjust the input signal to a constant common mode level involves connecting at least one switch to the start of the system, introducing additional capacitances and degrading the operating speed.

Another advantage of the proposed method is the fact that not only the offset voltage of the electronic circuit is compensated, but also the offset voltage of the dynamic comparator and electronic circuits is compensated, such as additional amplifiers that are between the electronic circuit (17) and the dynamic comparator (1).

Finally, because the method and circuit of the present invention is implemented with digital techniques, variations in offset voltage provided by variations in the manufacturing process, supply voltage and operating temperature are compensated by the method and circuits of the invention and the various invention embodiments.

This is because in the steps execution of the method and circuits in the present invention, it does not depend on the transition time, which is understood as the up or down time of the signals of any of the electronic circuit signals, nor of the circuit signals to compensate for the offset voltage; since the execution depends only on the frequency of the clock signal (3), which is related to the maximum frequency that both the dynamic comparator (1) and the digital-analogue converters (12) and (13) can develop. On the other hand, the impact of random or mismatch variations is reduced since they can be analyzed as additional offset sources that are also compensated by the present invention.

It should be understood the present invention is not limited to the modalities described and illustrated, because as it will be evident to a person versed in the art, there are variations and possible changes that do not depart from the invention spirit, which is only defined by the following claims.

Embodiment Example

Referring to the FIG. with an input signal of a 3 GHz (Vin) frequency and amplitude 10 mV (Voffl), required by the offset voltage requirement of both the electronic circuit, in this example a preamplifier, as in the comparator is less than 1 mV, and thus to maintain the same operating frequency, the frequency of the clock signal (3) is also 3 GHz.

Figure 4:
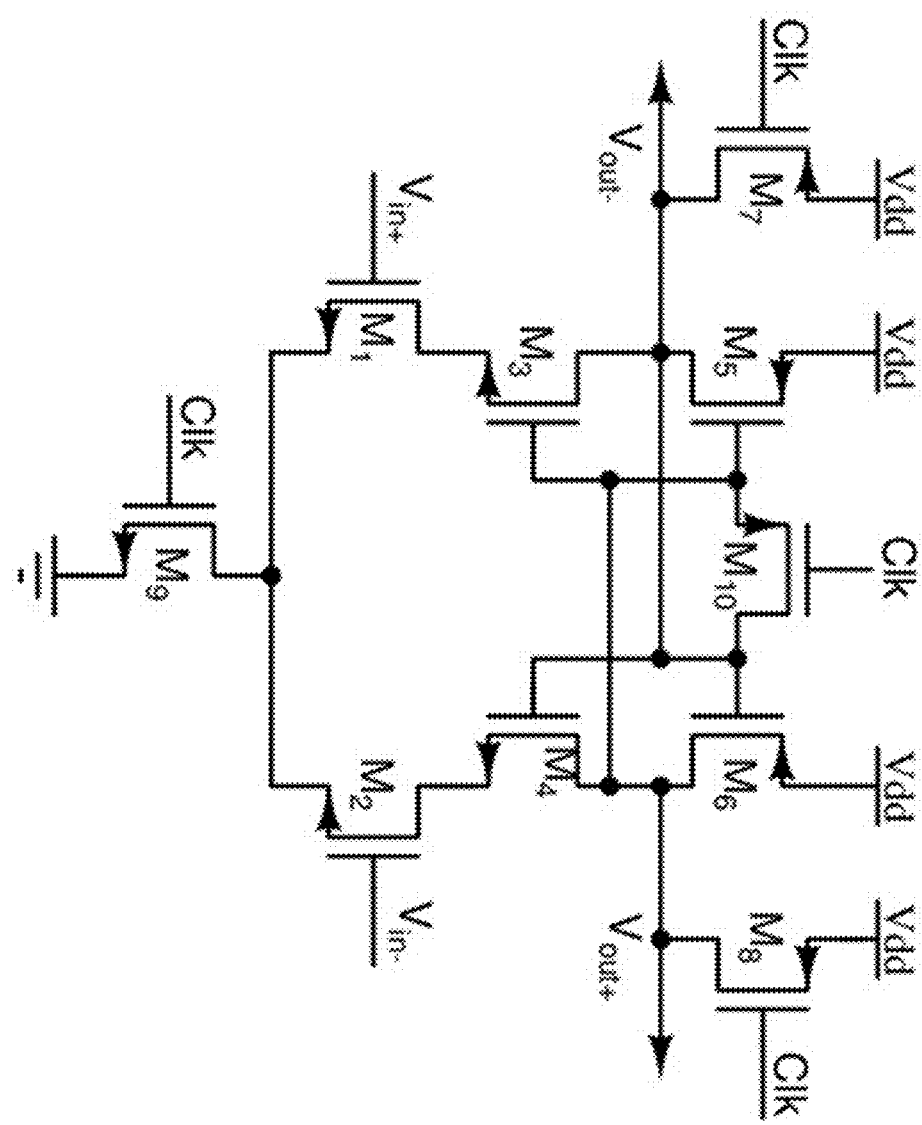
FIG. 4 Illustrates a circuit diagram of a dynamic comparator used as example of the Strong-Arm circuit of the invention.

Referring to FIG. 4 the comparator in the example corresponds to a Strong-Arm circuit, which is highly used in high-speed serial interfaces. Transistors ($M_7$), ($M_8$) and ($M_{10}$) act as comparator reset devices.

Figure 5:
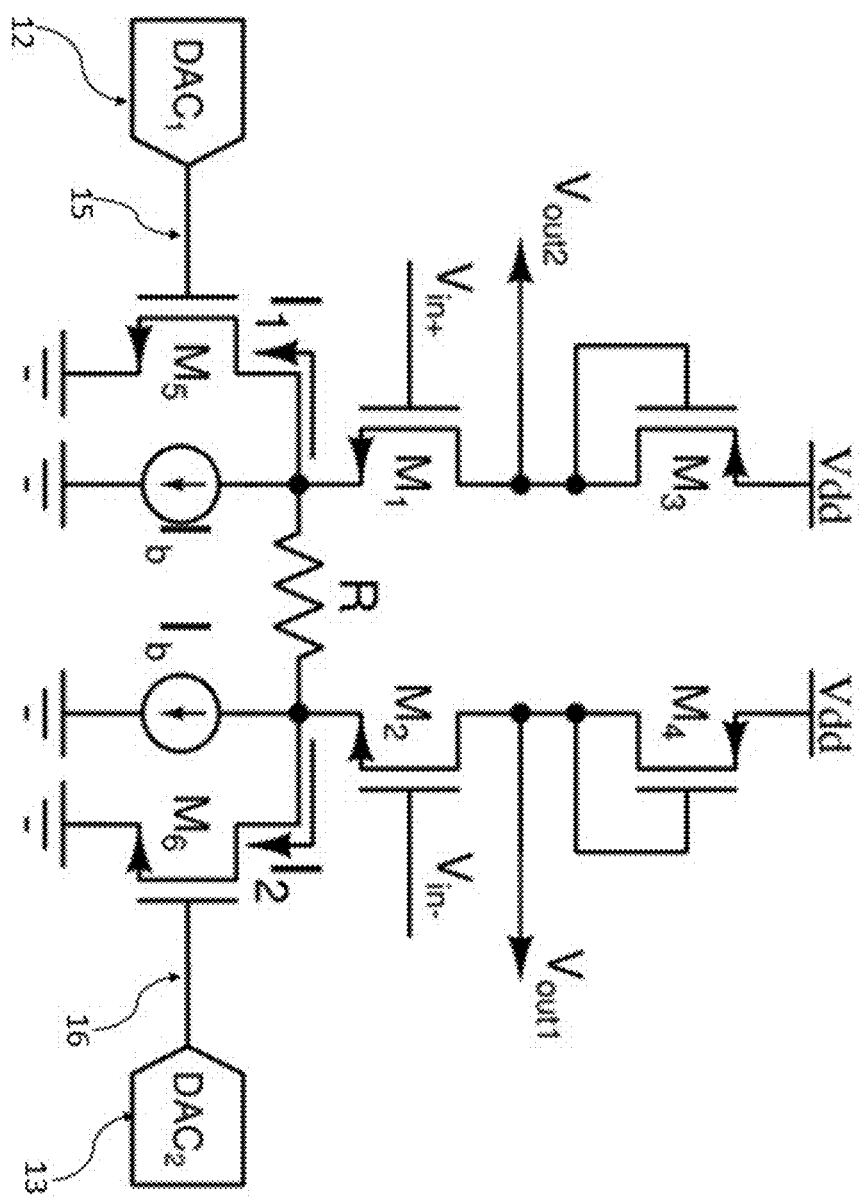
FIG. 5 Illustrates an NMOS differential pair used as an example of an electronic circuit with a polarization block.

Referring to FIG. 5 a differential pair NMOS degenerated by a resistor R, connected between the supply terminals of its input transistors, and with two polarization current sources for each branch: there is a first source ($I_b$) of constant value, and a second source implemented by transistors ($M_5$) and ($M_6$), which generate the current to compensate for the offset voltage of the entire circuit. Each polarization source is implemented by a single NMOS transistor, or by simple current mirrors. Additionally, the load of the differential pair consists of two PMOS transistors (one for each branch) connected in the diode configuration, that is to say with their interconnected drain and gate terminals. The output signal of the electronic circuit is of a differential nature, so that it can be applied to the comparator without any type of coupling or conditioning circuit. And the resolution of the digital-analog converters is 8 bits, and the first digital-analog converter DAC1 (12) and the second digital-analog converter DAC2 (13) are implemented by R2R circuits.

Figure 6:
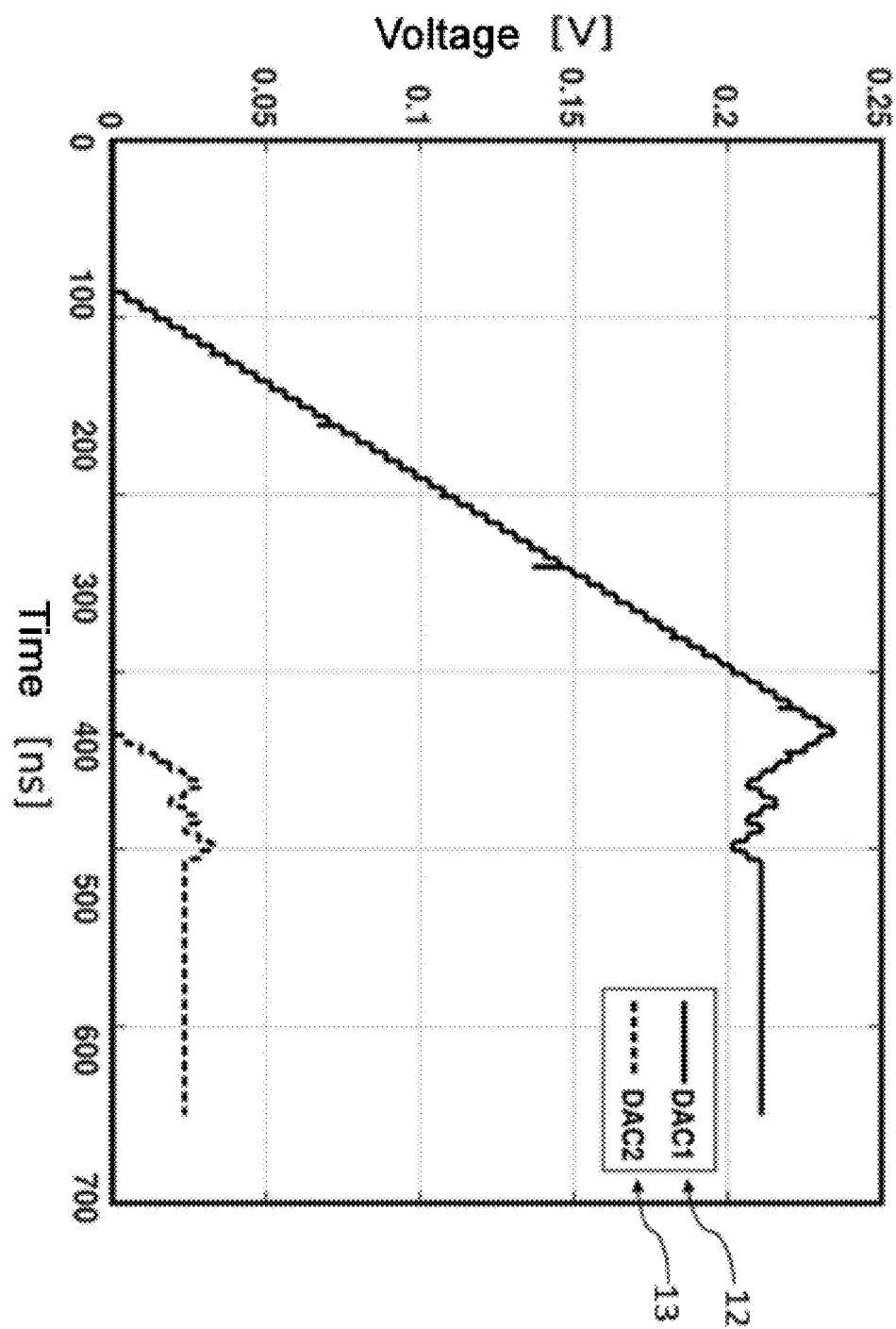
FIG. 6 Illustrates an output signal of the digital-analog converters DAC1 (12) and DAC2 (13) in an example.
Figure 7:
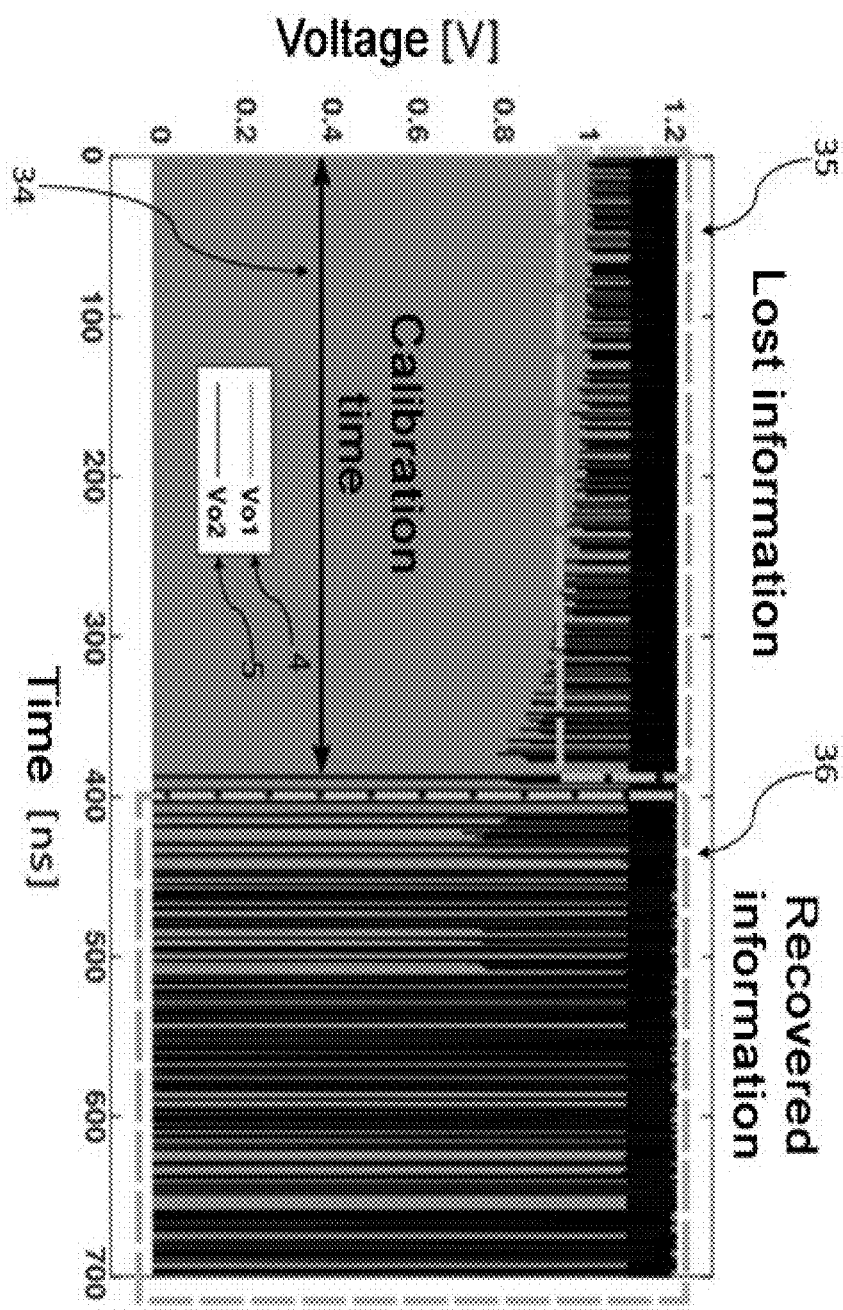
FIG. 7 Illustrates an example of the dynamic comparator output signal showing how offset voltage is compensated.

Referring to FIGS. 6 and 7 once the circuit begins to operate, the output signal of the comparator $V_{O2}$ (5) is saturated to the value of the supply voltage, while the signal $V_{O1}$ (4) ranges from VDD. That is the reason the transferred information is lost.

Referring to FIGS. 6 and 1 and the first digital-analog converter DAC1 (12) and the second digital-analog converter DAC2 (13) have a value of 0V and then, 90 ns later the offset compensation circuit begins to act making the signal of the first digital analog converter DAC1 (12) to increase in 5 mV with each clock cycle, while the signal of the second digital analog converter DAC2 (13) remains at 0V. As a consequence, the door-supplier voltage ($M_5$) of the transistor increases and therefore its current ($I_1$), making the transistor door-supplier voltage ($M_1$) greater than that of the transistor ($M_2$). In this way, an additional voltage with a polarity opposite to the offset voltage of the electronic circuit is induced. Finally, after 400 ns later, the circuit converges to compensate the offset voltage of electronic circuits and accentuates its stable state value. This causes the signals of the first digital-analog converter DAC1 (12) and the second digital-analog converter DAC2 (13) to remain constant, since the finite-state machine (9) goes into the "Save" state, which allows the information to be correctly recovered.

Referring to FIG. 7, the electronic circuit (17) shows a reduction in the offset voltage while the electronic circuit and the dynamic comparator (1) operate normally. At the beginning (32) the Vo2 signal (4) is anchored to the power rail (VDD) while the Vo1 signal (5) oscillates between VDD and ground, causing multiple errors at the exit and losing all kinds of information (35). After 400 ns the circuit is adjusted to the polarization current of the electronic circuit (17) so the first output (4) and the second output (5) of the dynamic comparator (1) can oscillate and change according to the electronic circuit input (17).

The invention claimed is:

1. A circuit to compensate the offset voltage of electronic circuits comprising:
   a dynamic comparator (1) having a first output (4) and a second output (5);
   a phase detector (6) connected to a first output (4) and a second output (5) of the dynamic comparator (1), the phase detector (6) has a first output (7) and a second output (8);
   a finite-state machine (9) connected to the first output (7) and the second output (8) of the phase detector (4), the finite-state machine (5) has a first output X1 (10) and a second output X2 (11);
   a first digital-analog converter (12) connected to the first output (10) of the finite-state machine (9);
   a second digital-analog converter (13) connected to the second output (11) of the finite-state machine (9); and,
   a polarization block (14) with a first input (15) connected to the output of the first digital-analog converter (12) and a second input (16) connected to the output of the second digital-analog converter (13);
   wherein the polarization block (14) polarizes an electronic circuit (17) and the dynamic comparator (1), the phase detector (6), and the finite-state machine (9) are connected to a clock signal (3).

2. The circuit to compensate the offset voltage of claim 1, wherein the first output X1 (6) and the second output X2 (7) of the finite-state machine (5) correspond to digital outputs of 8 bits in length.

3. The circuit to compensate the offset voltage of claim 1, wherein the phase detector (6) is an Ascending/Descending counter with enabling terminals.

4. The circuit to compensate the offset voltage of claim 1, wherein the phase detector (6) comprises:
   a first D-type Flip-Flop (18) activated by rising edge, where its D input is connected to the first output (4) of the dynamic comparator (1) and its clock signal input is connected to the clock signal (3);
   a second D-type Flip-Flop (20) activated by falling edge, where its D input is connected to the first output (4) of the dynamic comparator (1); its clock signal input is connected to the clock signal (3);
   a third D-type Flip-Flop (21) activated by rising edge, where its D input is connected to the second output (5) of the dynamic comparator (1); and its clock signal input is connected to the clock signal (3);
   a fourth D-type Flip-Flop (23) activated by falling edge, where its D input is connected to the second output (5) of the dynamic comparator (1); and its clock signal input is connected to the clock signal (3);
   a first two-input XOR gate (19), the first input (24) of the first XOR gate (19) is connected to the Q output of the first D-type Flip-Flop (18), the second input (25) of the first XOR gate (19) is connected to the Q output of the second D-type Flip-Flop (20) and the output of the first XOR gate (19) delivers an UP signal (7);
   a second two-input XOR gate (22), the first input (26) of the second gate XOR (22) is connected to output Q of the third D-type Flip-Flop (21), the second input (27) of the second XOR gate (22) is connected to output Q of the fourth D-type Flip-Flop (23); and the output of the second XOR gate (22) delivers a DOWN signal (8).

5. A method to compensate the offset voltage of electronic circuits, characterized by the steps:
   a) connecting a dynamic comparator to the output of the electronic circuit;
   b) measuring the phase change of the dynamic comparator outputs in step a by means of a phase detector;
   c) controlling the output signals of a finite-state machine according to the output of a step b phase detector, which can be coded "forward", "backward" or "in phase";

d) converting the output of the finite-state machine of step c to an analog signal using two digital-analog converters;

e) connecting the output of the two digital-analog converters of step d to the polarization block control terminal of the electronic circuit; and, f) modifying the polarization current of the electronic circuit polarization block by means of the output signals of the two digital-analog converters connected in step e.

6. The method to compensate the offset voltage of claim 5, characterized given it fulfills the following state transition sequence in step c:

Starting in the "Start" (28) state, if the UP input signal (7) changes from a low to high state, the machine changes to the "Increase Pol" state (30) where the output signal X2 decreases by one unit and the X1 signal increases by one unit;

Starting in the "Start" state, if the DOWN input signal (8) changes from a low to high state, the machine changes to the "Decrease Pol" state (31) where the output signal X2 increases by one unit and the signal X1 decreases by one unit;

Starting in the "Increase Pol" state (30), if the UP input signal (7) changes from a low to high state, the machine remains in the same state;

Starting in the "Decrease Pol" state (31), if the DOWN input signal (8) changes from a low to high state, the machine remains in the same state;

Starting in the "Increase Pol" state (30), if the UP input signal (7) changes from a low to high state and DOWN (8) changes from a low to high state, the machine goes to the "Save" state (32) where signals X1 (10) and X2 (11) are not altered;

Starting at the "Decrease Pol" state (31), if the DOWN input signal (8) changes from a low to high state and the UP input signal (7) changes from a low to high state, the machine goes to the state "Save" (32) where signals X1 (10) and X2 (11) are not altered and saved;

Starting in any of the four states, if the reset signal goes to a high state, the machine goes to the "Start" state (28).

* * * * *